United States Patent [19]

Knight

[11] Patent Number: 4,857,933

[45] Date of Patent: Aug. 15, 1989

[54] ANALOGUE TO DIGITAL CONVERTER OF THE MULTI-SLOPE TYPE

[75] Inventor: Richard B. D. Knight, Woking, United Kingdom

[73] Assignee: The Secretary of State for Defence in Her Britannic Majesty's Government of the United Kingdom of Great Britain and Northern Ireland, London, England

[21] Appl. No.: 154,037

[22] Filed: Feb. 9, 1988

[30] Foreign Application Priority Data

Feb. 11, 1987 [GB] United Kingdom ............... 8703100

[51] Int. Cl.⁴ ............................................. H03M 1/60
[52] U.S. Cl. .................................. 341/168; 341/128; 341/167
[58] Field of Search ............... 341/128, 118, 129, 167, 341/168, 157

[56] References Cited

U.S. PATENT DOCUMENTS

| | | | |
|---|---|---|---|
| 4,161,724 | 7/1979 | Smutny | 341/167 |
| 4,164,733 | 8/1979 | Landsburg et al. | 341/157 |
| 4,354,176 | 10/1982 | Aihara | 341/168 |
| 4,584,566 | 4/1986 | Arcara | 341/128 |

Primary Examiner—William M. Shoop, Jr.
Assistant Examiner—Helen Kim
Attorney, Agent, or Firm—Nixon & Vanderhye

[57] ABSTRACT

An analogue to digital multi-slope converter has an integrator 10 to which an analogue input signal 30 is continuously applied. A reference voltage 36, 37 is superimposed onto the integrator input 30 in pulse form, being switched on and off according to a predetermined program controlled by a clock and modified by a comparator 11 such that reference voltage pulses occur in pairs of opposite polarity. The sequence of pulses is applied in such a manner that the final pulse of a sequence causes the integrator output to move towards a comparator 11 reference level, the reference voltage then being maintained until the reference level is reached after which a new cycle is started.

4 Claims, 5 Drawing Sheets

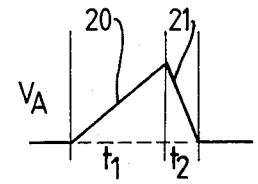
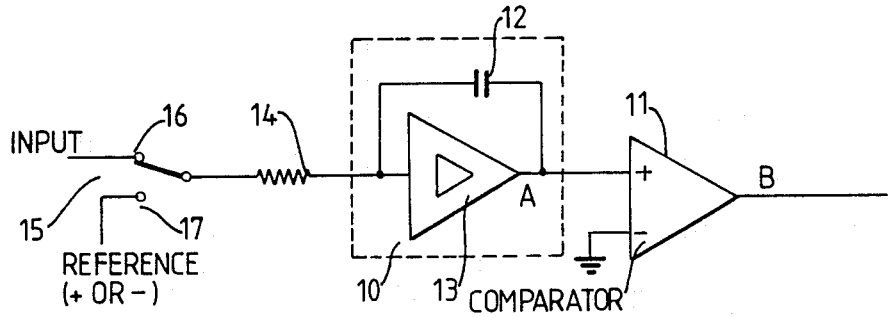
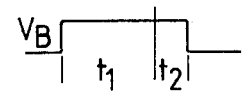
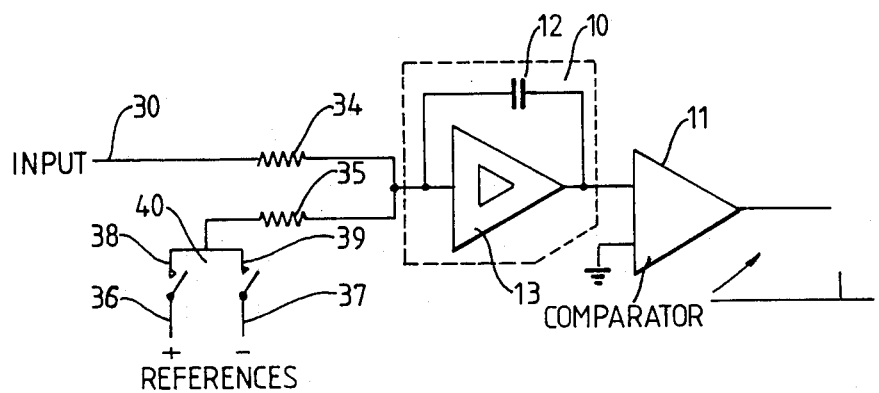

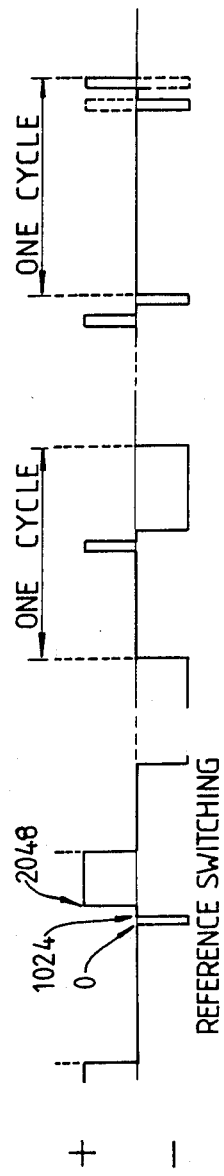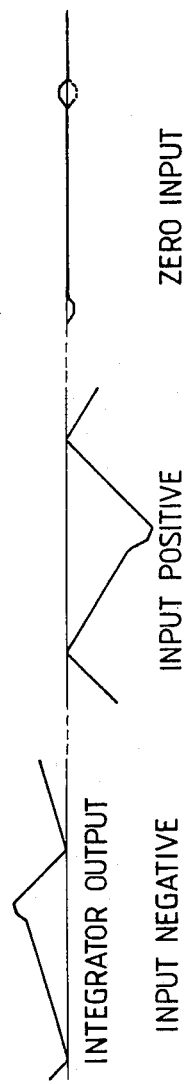

4,857,933

ANALOGUE TO DIGITAL CONVERTER OF THE MULTI-SLOPE TYPE

BACKGROUND OF THE INVENTION

1. Field of the Invention

The present invention relates to analogue to digital converters of the dual slope type.

2. Description of Prior Art

A conventional dual slope analogue to digital converter includes an integrator, a comparator, a clock and a reference voltage of opposite polarity to an input signal voltage. The signal voltage is integrated for a predetermined time controlled by the clock. The integrator is then disconnected from the signal voltage and connected to the reference voltage. When the output voltage from the integrator reaches zero the integrator is disconnected from the reference voltage and the circuit is switched into a resting phase. The duration of the reference voltage connection, which is proportional to the mean value of signal during the integration period, is measured in digital form by counting pulses from the clock. The digital output is the required value of the analogue signal input.

Analogue to digital converters of this type are simple and cheap and the use of the same clock for all timing purposes self-compensates for many possible sources of error. However, there are still limitations which preclude their use for high precision applications. Among the problem areas are dielectric storage in capacitors used in integrators, detection of the integrator zero point and the obtaining of a smooth cross-over as the input signal changes sign.

The use of converters in which the signal is fed continuously to the integrator has been described in U.S. Pat. No. 4361831 and in U.K. Pat. No. 1434414. U.S. Pat. No. 4,361,831 describes a converter in which the signal is fed continuously to the integrator and an auxiliary signal, or signals, part of the time. However, in this scheme a more complicated logic system is required and one or other of the auxiliary signals is always in use.

U.K. Pat. No. 1434414, also discloses a converter in which signal and reference may be connected simultaneously to an integrator. However this system requires two level detectors (or comparators) and the superposition of a period signal upon the integrator output.

SUMMARY OF THE INVENTION

The present invention provides an improved form of dual slope analogue to digital converter with a comparatively simple logic system and requiring only a single comparator.

According to the present invention an analogue to digital multi slope converter includes an integrator, a comparator, a clock, means whereby an analogue signal may be continuously applied to the integrator and means whereby a reference voltage can be superimposed in pulse form on the integrator input, the reference voltage being switched on and off according to a predetermined programme controlled by the clock and modified by the comparator, the programme being such that the reference voltage pulses occur in pairs of opposite polarity, there being the same number of pulses per cycle of each polarity, and such that during each cycle the reference signals are applied to the integrator in an order which returns the integrator output to the comparator reference level.

BRIEF DESCRIPTION OF THE DRAWINGS

In order that the invention may be better understood an embodiment, and some examples of integrator voltage waveforms using typical predetermined programmes, will now be described, by way of example only, with reference to the accompanying diagrammatic drawings, of which:

FIG. 1 is a circuit diagram of relevant portions of a conventional dual slope analogue to digital converter, FIGS. 1a, 1b illustrate integrator and comparator output voltages respectively during a typical operational cycle of the circuit illustrated in FIG. 1, FIG. 2 is a circuit diagram of relevant portions of a multi slope analogue to digital converter according to the invention, FIGS. 7, 8 illustrate the resulting waveforms for negative, positive and zero inputs.

DETAILED DESCRIPTION OF PREFERRED EMBODIMENTS

Figure 3A:
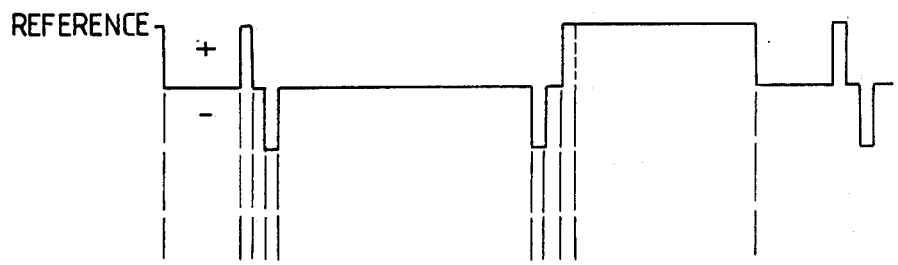
FIGS. 3a, 3b show respectively a typical predetermined programme of combinations of reference voltage with an input signal, and the resultant integrator voltage.

A conventional analogue to digital dual slope converter (FIG. 1) has an integrator, shown generally at 10, and a comparator 11. The integrator 10 typically includes a capacitor 12 connected as the feedback element for an operational amplifier 13. A two way switch 15 has one contact 16 connected to an input signal voltage and the other contact 17 connected to a reference voltage which is of opposite polarity to the signal voltage, and is connected through a resistor 14 to the integrator 10.

In use the input signal is applied to the integrator 10 via contact 16 for a predetermined time t1 controlled by a clock (not shown). During this time the integrator 10 voltage rises as shown at 20 in FIG. 1a. At the end of t1 the switch 15 is operated (by means not shown) to connect the reference voltage via contact 17 to the integrator. As the reference has the opposite polarity to the signal voltage the integrator voltage decreases as shown at 21 in FIG. 1a. The point at which the voltage reaches zero is sensed by the comparator 11, and the circuit switched into a resting phase. In order that the comparator output returns to zero, the charge entering the capacitor 12 during the interval t1 must be exactly equal to that withdrawn during t2. As the reference signal is constant, the time t2 is proportional to the mean value of the input signal. The time t2 is measured by counting clock pulses and the digital result is the digital output of the conversion process.

In the converter according to the present invention (FIG. 2) the integrator 10 and comparator 11 are similar to those in the conventional converter. An input signal line 30 is permanently connected through a resistor 34 to the integrator 10. Reference voltage lines 36, 37 by means of which a reference voltage of either negative or positive polarity can be supplied, are connected to contacts 38, 39 of a switch 40 which is connected through a resistor 35 to the integrator 10.

In use, the converter operates in a series of cycles, as with a conventional dual slope converter. However with this novel converter the input signal is permanently connected to the integrator 10. An even number of reference voltage pulses are superposed on the input to the integrator 10 by operation of the switch 40 according to a predetermined programme controlled by a clock (not shown) and the comparator 11. The pulses are closely associated in pairs of opposite polarity with provision for the second pulse of one pair in each cycle to be maintained until the integrator voltage is returned to zero, the time for this to take place being recorded by counting clock pulses. Zero output from the integrator 10 is sensed by the comparator 11 which activates the initiation of the next cycle.

Figure 3B:
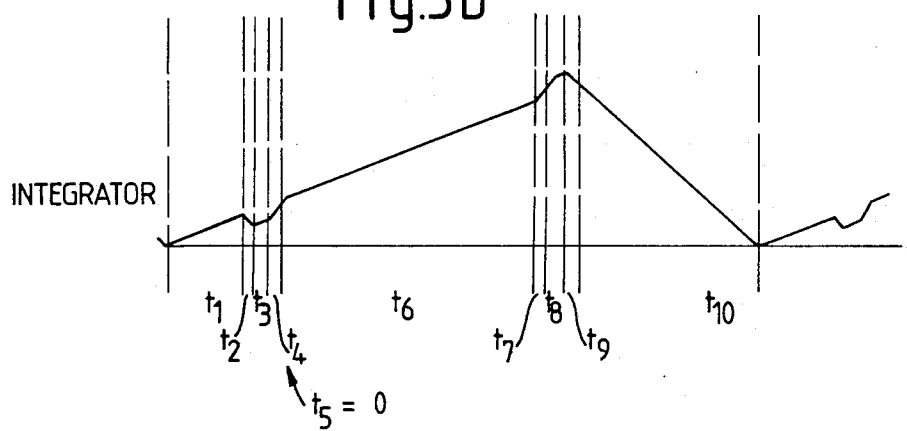

The means by which the analogue input signal is converted into digital form may best be understood by reference to the typical operating cycle illustrated in FIGS. 3a and 3b. A negative input signal is applied to the integrator 10 causing the integrator output voltage to rise (FIG. 3b). After a time t1 the positive reference is switched on for a (fixed) time t2, during which the rise of integrator voltage is reversed. For a (fixed time t3 there is no superposition of any reference voltage and the integrator voltage rise is dependent only on the input signal. The negative reference voltage is then connected for a time t4 (conventionally, but not necessarily, the same as t2) causing the rate of integrator voltage rise to increase. At the end of the period t4 the state of the integrator voltage is examined by the comparator 11, and if the combination of the comparator 11 state and the presently selected reference polarity indicates that the integrator voltage is moving towards zero this reference is maintained, the time (t5) for zero to be reached being recorded by counting clock pulses. If not (as illustrated in FIG. 3b, and hence t5 here equals zero) the reference voltage is switched off and the integrator voltage is allowed to rise for a period t6 under the influence of the input signal only. The negative reference is then switched on again for a time t7 (conveniently, but not necessarily equal to t2), the input signal only applied for a time t8 (conveniently but not necessarily equal to t3) and a positive reference applied for a time t9 (conveniently, but not necessarily equal to t4). At the end of the time t9 the comparator 11 again examines the integrator output voltage and (as illustrated) because this is moving towards zero the positive reference voltage is maintained. The time, t10, for the integrator voltage to reach zero is recorded by counting clock pulses. When the voltage reaches zero the cycle is complete and the next commences.

During the sequence the positive reference has been connected for a time (t2+t9+t10) and the negative reference for a time (t4+t5+t7). As the combination of integrator 10 and comparator 11 show that no net charge has accumulated the difference (t4+t5+t7)−(t2+t9+t10) is proportional to the mean value of the input signal, and can be used to provide the required digital result.

In one simplified case, which can easily be arranged by suitable programming of the clock sequence, the times t2, t4, t7 and t9, and t3 and t8, can be made equal, and the difference (t5−t10) is then proportional to the input signal. In general one of the times t5 or t10 should be zero, since finite values of both would imply that the input signal had both polarities (which could occur if the signal were small and noisy).

The ratio of the input voltage to the reference, including allowance for the sign of the input, is (t5−t10)/(−the total cycle time, from t1 to t10). All the times are measurable or already fixed, so the magnitude of the input can be calculated in terms of the reference and, with suitable scaling, displayed directly in terms of voltage or other convenient units.

A further simplification results if it is arranged that the initiation of the timing periods t2 and t7 take place at uniform intervals. This is possible because t1 is free to be chosen to satisfy an independent requirement, in this case that (t5+t6)=(t10+t1). The duration of each cycle is now fixed, simplifying the calculation of the final result.

With this arrangement the integrator needs to be set into a state where the peak voltage reached is such that the period t5 (or t10) has the correct duration to match t6 (or t1). This can be arranged to occur automatically with the arrangement of FIG. 2: any error in timing between the operation of the comparator 11 and the clock sequence leads to t1 (or t6) having the wrong duration. Consequently, the peak voltage reached by the integrator will differ from the ideal value and so the duration of t10 (or t5) will be changed. For example, if t10 is too long in one cycle, t1 will be too short in the next and cause the associated t10 to be shorter, reducing the initial error. After a few cycles an equilibrium will be obtained at the correct working point.

Figure 4A:
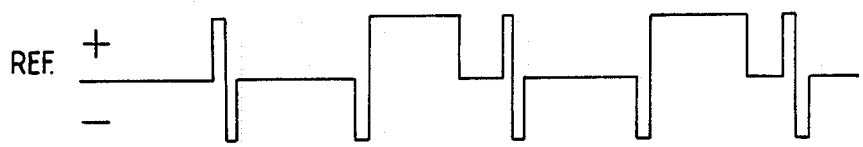
FIGS. 4a, 4b illustrate another typical predetermined programme similar to that shown in FIG. 3, FIGS. 5a, 5b illustrate the effect of the programme shown in FIG. 4 when the input signal voltage is zero.
Figure 4B:
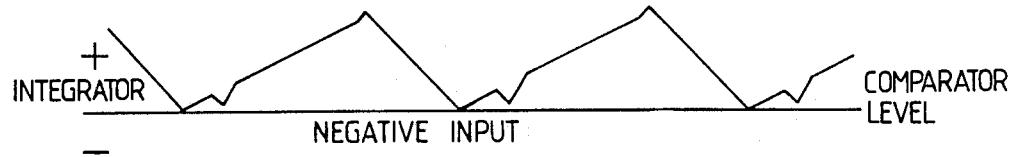
Figure 5A:
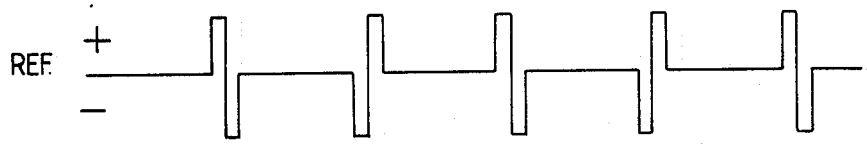
Figure 5B:
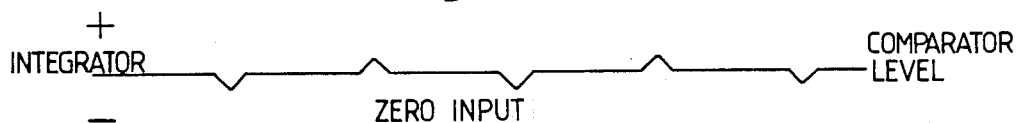
Figure 6:
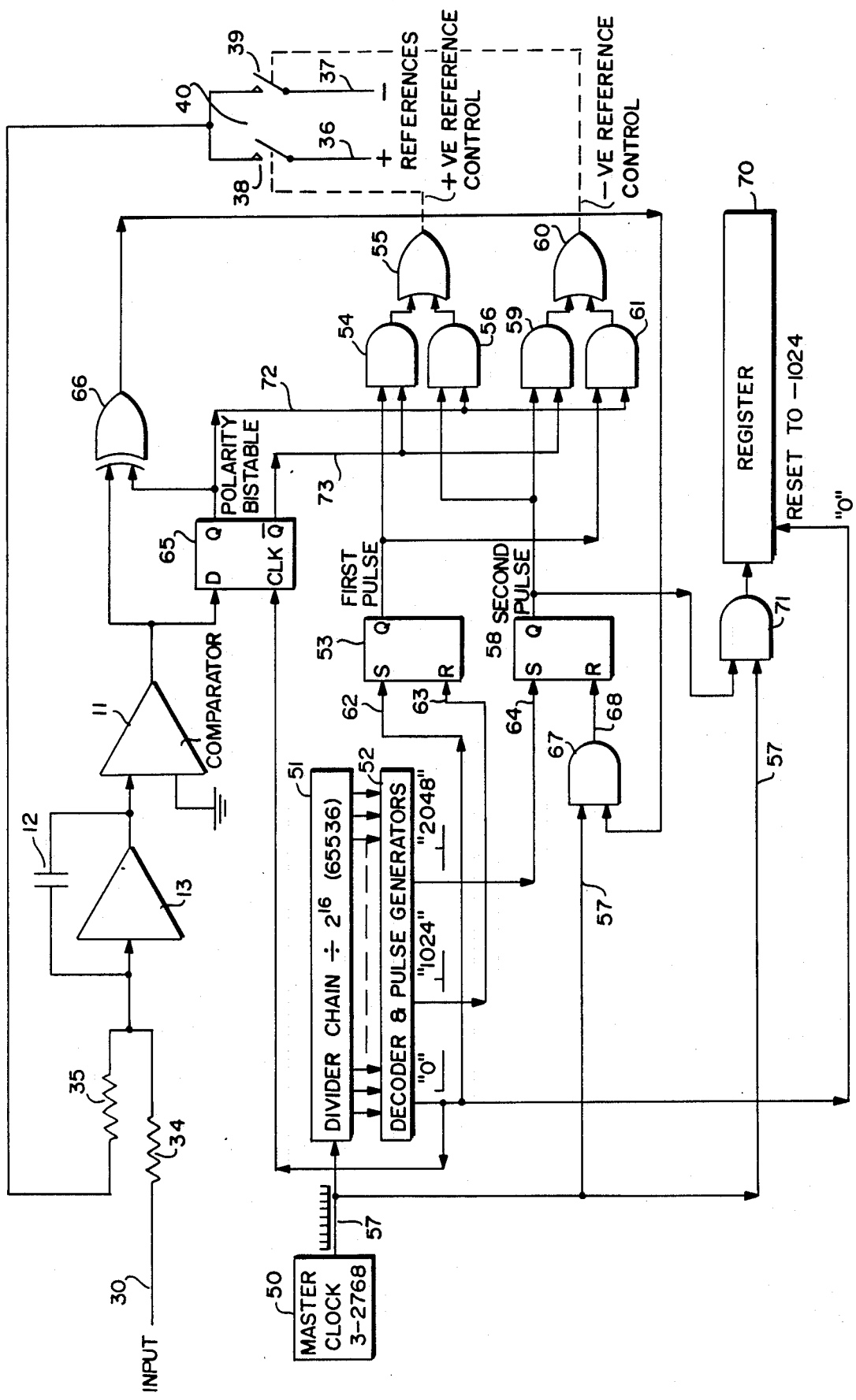
FIG. 6 illustrates the clock and associated circuits which control a further example of a predetermined programme.

Examples of waveforms occuring in such a simplified system are shown in FIG. 4 and FIGS. 5a and 5b. FIGS. 5a and 5b the particular case where the input is zero.

It will be observed that, in the sequence so far described, one pair of pulses is redundant, since the effect of a positive reference pulse is exactly balanced by an adjacent negative reference pulse. One example occurs at t2 and t4 in FIG. 3.

A further embodiment of the invention requiring only a single pair of pulses, is illustrated in greater detail in FIG. 2 and FIGS. 6a, 6b and 6c.

A master clock 50 (FIG. 6a) controls a divider chain 51 which in turn controls a decoder and pulse generator 52. The pulse generator 52 provides pulses locked to the clock when the divider reaches values of $0_1 2^n$ (for example 1024) and $2^{n+1}$ (for example 2048), as indicated at 62, 63 and 64.

The comparator 11 (see FIG. 6b) has an output to an exclusive—OR gate 66. The comparator also has an output to a D-type bistable 65 which also has an input from the 0 pulse 62 and outputs 72 and 73 signifying positive and negative polarity of input signal at 30 respectively. The exclusive—OR gate 66 has an output to an AND gate 67 which also has an input 57 from the clock 50. The AND gate 67 has an output 68.

The switch 40 (FIG. 6c) has a first R-S Bistable 53 having inputs from the 0 pulse 62 and 1024 pulse 63, an output to an AND gate 54 which also has an input 73 from the polarity bistable 65 and an output to an AND gate 61 which also has an input 72 from the polarity bistable 65. The switch 40 also has a second R-S Bistable 58 having inputs from the 2048 pulse 64 and output 68 of the AND gate 67 (FIG. 6b), an output to an AND gate 56 which also has an input 72 from the polarity bistable 65, and output to an AND gate 59 which also has an input 73 from the polarity bistable 65. The AND gates 54, 56 have outputs to an OR gate 55, and the AND gates 59, 61 have outputs to an OR gate 60. The second Bistable 58 also has an output to an AND gate 71 which also has an input 57 from the clock 50. The AND gate 71 has an output to a Register 70 which also has an input from the 0 pulse 62.

As the comparator 11 compares the integrator 10 output with zero its output is at a logical 1 or a logical 0 if the integrator output is respectively positive or negative.

In operation the signal 62 from the comparator 11 is applied to the D input of the D-type bistable 65. At the instant the 0 pulse occurs bistable 65 is clocked and copies the state of the comparator 11. The 0 pulse also sets the R-S bistable 53 which controls the duration of the first reference pulse. Taking as an example the case where the input signal 30 (FIG. 2) is negative (FIGS. 7a, 8a) the integrator (10) output is positive. The logic path through AND gate 61 and OR gate 60 is transparent, switching the negative reference 37 into superimposition on the input signal 30. When the 1024 pulse 63 occurs the bistable 53 is reset and the negative reference 37 removed from the input signal 30.

When the 2048 pulse occurs the second bistable 58 is set switching the positive reference 36 to be superimposed on the input signal 30 through AND gate 56 and OR gate 55. The integrator output signal now moves towards zero.

The outputs of the comparator 11 and the bistable 65 are compared by the exclusive—OR gate 66. When the integrator 10 output passes through zero the comparator 11 output changes causing gate 66 to change logic state. The signal 68 from gate 66 to the bistable 58 removes the positive reference 36 from the input signal 30 at the next clock pulse, and a new cycle starts.

The digital result of the conversion process appears in the register 70. When the 0 pulse occurs, this register is set to a value corresponding to a count of—1024. The AND gate 71 allows clock pulses to enter the register and be counted throughout the duration of the second reference pulse. At the end of the conversion cycle the number in the register, taken in conjunction with the information in the polarity bistable 65, is the required result.

Examples of waveforms which occur for a typical positive signal and zero inputs are also shown in FIGS. 7b, 8b and 7c, 8c. As before described, the integrator output working point is established in each case by the feedback implicit in the system.

A further advantage of the new system is that high resolution may be obtained easily. As new measurement cycles occur continuously and the input is permanently connected to the integrator, any charge not balanced at the end of a cycle is carried forward into the next, where it can contribute to the subsequent measurement. Additional resolution may therefore be obtained simply by combining the results of many measurement cycles.

It will be realised that the reference signals must be switched on for a duration sufficient to allow switching transients to die to negligible levels and that alternative arrangements are possible in which current signals replace voltage signals applied to resistors without affecting the basic principles of the invention.

What is claimed is:

1. An analog-to-digital converter of the multi-slope type for converting an analog electrical signal to a digital output in at least one cycle of operation, said converter comprising:
   an integrator having an input and an output;
   application means for applying said electrical signal to said integrator input;
   supply means for supplying positive and negative reference signals;
   switch means for applying in a cycle, pulses of said reference signals to said integrator input in pairs of opposite polarity and with the same number of positive pulses as negative pulses;
   a comparator having an input connected to said integrator output, said comparator having an output;
   recognition means for recognizing a change of state of said comparator;
   actuation means, responsive to said recognition means, for actuating said switch means to maintain application of said pulses of reference signals for a predetermined duration except for a final pulse in a final pair of pulses, where said final pulse is maintained until said recognition means indicates a change of state of said comparator;
   bistable multi-vibrator means connected to said comparator output;
   command means for commanding said bistable multi-vibrator means to memorize a state of said comparator;
   timing means for providing a programmed series of timing pulses including timing pulses for operating said actuation means;
   terminating means, responsive to a timing pulse from said timing means and further responsive to said recognition means, for terminating a cycle and starting another cycle;
   subtraction means, responsive to time durations of said positive reference signal pulses and negative reference signal pulses, for providing a difference output indicative of the difference between total duration of applications of positive reference pulses and total duration of applications of negative reference pulses; and
   conversion means, responsive to said subtraction means, for converting said time difference into a digital output.

2. An analogue to digital multi slope converter as claimed in claim 1 wherein the integrator output is examined by the comparator at the end of each second pulse of a pair, the reference voltage of that pulse being maintained, if the combination of the comparator state and the presently selected reference polarity indicates that the integrator output is moving towards the comparator reference level, until the comparator reference level is reached after which the reference voltage is discontinued and a new cycle started.

3. An analogue to digital converter as claimed in claim 1 wherein there is one pair of pulses, wherein the reference voltage applied by the first pulse is of the same polarity as the input signal, and wherein the reference voltage applied by the second pulse is maintained until the comparator reference level is reached, after which the reference voltage is discontinued and a new cycle started.

4. An analog-to-digital converter of the multi-slope type for converting an analog electrical signal to a digital output in at least one cycle of operation, said converter comprising:
   an integrator having an input responsive to said analog electrical signal, and an output;
   supply means for controllably supplying positive and negative reference signals to said integrator output;

a comparator having an input connected to said integrator output, said comparator having an output;

recognition and actuation means, responsive to a change of state of said comparator, for controlling said supply means to discontinuously apply, in one cycle, pulses of said reference signals in pairs of opposite polarity and with the same number of positive pulses as negative pulses and for maintaining application of said pulses of reference signals for a predetermined pulse duration except for a final pulse in a final pair of pulses, where said final pulse is maintained until a change of state occurs in said comparator;

timing means for providing a programmed series of timing pulses including timing pulses for operating said recognition and actuation means;

terminating means, responsive to a timing pulse from said timing means and further responsive to said recognition and actuation means responding to a change of state of said comparator, for terminating a cycle and starting another cycle;

subtraction means, responsive to pulse durations of said positive reference signal pulses and negative reference signal pulses, for providing a different output indicative of a time difference between a total duration of applications of positive reference pulses and a total duration of applications of negative reference pulses; and conversion means, responsive to said subtraction means, for converting said time difference into a digital output.

* * * * *